United States Patent [19]
Horikawa et al.

[11] Patent Number: 5,954,993
[45] Date of Patent: Sep. 21, 1999

[54] PIEZOELECTRIC CERAMIC COMPOSITION AND METHOD FOR PRODUCING PIEZOELECTRIC CERAMICS

[75] Inventors: Katsuhiro Horikawa, Shiga-ken; Akira Ando, Omihachiman, both of Japan

[73] Assignee: Murata Manufacturing Co., Ltd., Japan

[21] Appl. No.: 09/022,201

[22] Filed: Feb. 11, 1998

[30] Foreign Application Priority Data

Feb. 19, 1997 [JP] Japan ................................... 9-034558

[51] Int. Cl.$^6$ ........................................... H01L 41/18
[52] U.S. Cl. .................................. 252/62.9 PZ; 501/134; 501/136
[58] Field of Search ................... 252/62.9 PZ; 501/134, 501/136

[56] References Cited

FOREIGN PATENT DOCUMENTS 49-45117 12/1974 Japan .
54-38319 11/1979 Japan ............................. 252/62.9 PZ
1622343 1/1991 U.S.S.R. .

OTHER PUBLICATIONS

Chemical Abstracts citation 100:220180: abstract for SU 1,077,868, Mar. 7, 1984.

Primary Examiner—C. Melissa Koslow
Attorney, Agent, or Firm—Ostrolenk, Faber, Gerb & Soffen, LLP

[57] ABSTRACT

A Mo side component is added to the essential component of a piezoelectric ceramic composition containing Pb, Zr, Ti and O, in an amount of from about 0.06% by weight to about 5.0% by weight, in terms of $MoO_3$, relative to the amount of the essential component. Preferably, the side component is added to the calcined essential component, and the resulting mixture is fired to give a sintered piezoelectric ceramic composition. The addition of the side component improves the low-temperature sinterability of the piezoelectric ceramic composition without worsening the piezoelectric characteristics of the composition.

3 Claims, 3 Drawing Sheets

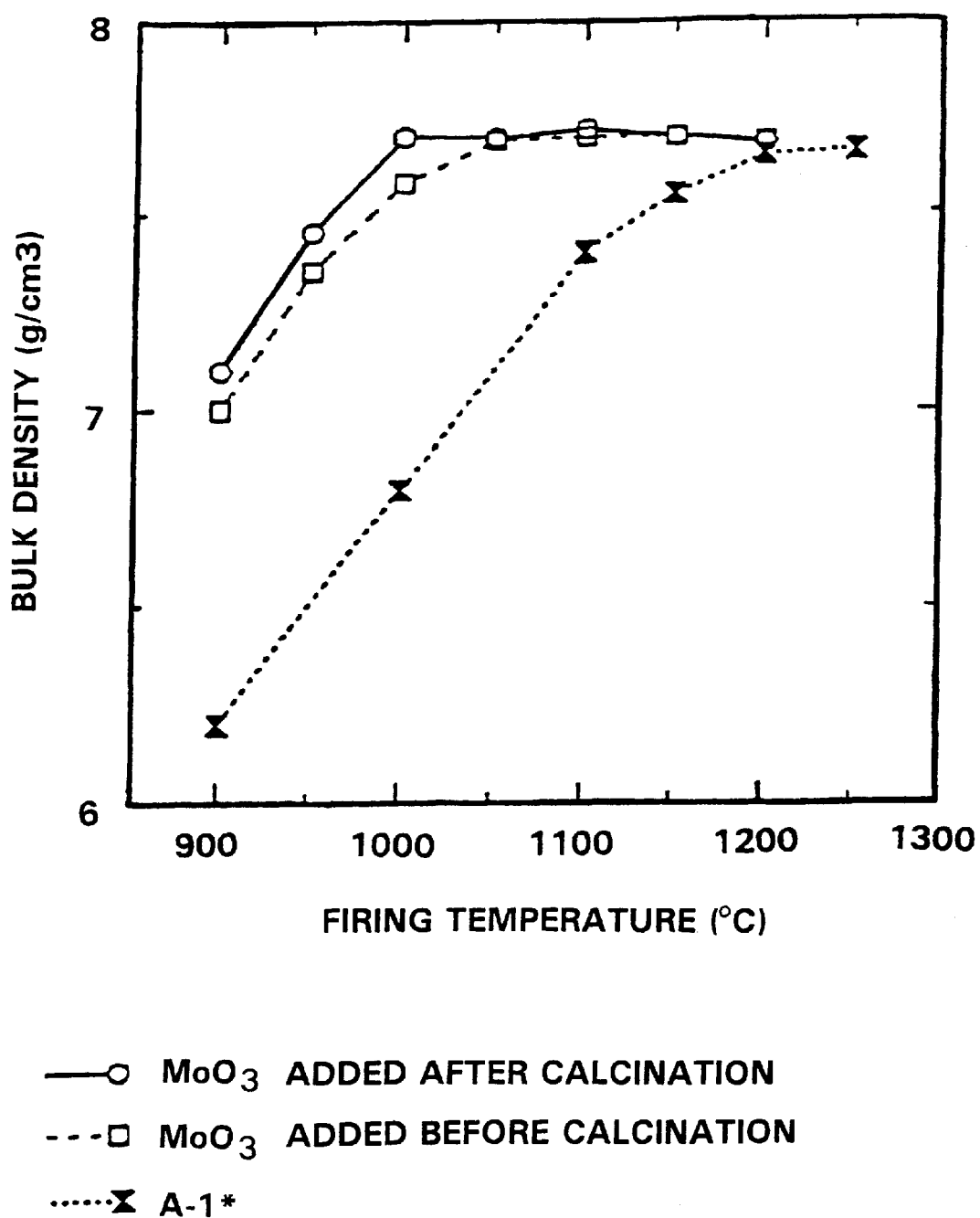

PIEZOELECTRIC CERAMIC COMPOSITION AND METHOD FOR PRODUCING PIEZOELECTRIC CERAMICS

FIELD OF THE INVENTION

The present invention relates to a piezoelectric ceramic composition and a method for producing piezoelectric ceramics, and, in particular, it relates to a piezoelectric ceramic composition comprising Pb, Zr, Ti and O, and to a method for producing piezoelectric ceramics comprising those elements.

BACKGROUND OF THE INVENTION

As piezoelectric ceramic materials containing Pb, Zr, Ti and O, for example, known are two-component materials such as $PbZrO_3$-$PbTiO_3$, three-component materials such as $Pb(Sb_{0.5}Sn_{0.5})O_3$-$PbZrO_3$-$PbTiO_3$, and composite materials prepared by adding various minor additives to those materials.

Having good piezoelectric characteristics and capable of being processed with ease and being easily produced in large quantities in mass-production systems, these piezoelectric ceramic materials have many applications in various fields of filters, actuators, piezoelectric transformers, piezoelectric sensors, etc.

Recently, various monolithic piezoelectric structures are being used in those application devices. Monolithic piezoelectric structures comprise a plurality of piezoelectric ceramic layers and a plurality of electrodes sandwiched between the adjacent piezoelectric ceramic layers, in which the layers and the electrodes are integrally laminated. To produce such monolithic piezoelectric structures, the piezoelectric ceramic materials and electrode materials for those must be co-fired.

However, the conventional piezoelectric ceramic materials such as those mentioned above generally have a high sintering temperature of about 1200° C. or so. Therefore, expensive electrode materials such as Pt must be used along with those piezoelectric ceramic materials to obtain the intended monolithic piezoelectric structures. If, on the other hand, inexpensive electrode materials such as AgPd are used, some sintering aids such as PbO and $SiO_2$ must be added to the piezoelectric ceramic materials to thereby lower their sintering temperature.

The use of expensive electrode materials is unfavorable, since the costs of the materials for piezoelectric application devices increase. On the other hand, the addition of sintering aids such as PbO and $SiO_2$ is also unfavorable, as they worsen the piezoelectric characteristics of the piezoelectric ceramic materials containing such sintering aids. In order to prevent the worsening of the piezoelectric characteristics, some measures may be taken to optimize the piezoelectric ceramic compositions themselves or to optimize the amount of the additive to be added to the piezoelectric ceramic compositions, thereby improving their piezoelectric characteristics. These measures, however, are problematic in that novel piezoelectric ceramic materials that are exclusively applicable to the production of monolithic piezoelectric structures must be developed and that development takes a lot of time and is expensive.

SUMMARY OF THE INVENTION

The object of the present invention is to provide a piezoelectric ceramic composition and a method for producing piezoelectric ceramics, in which are used conventional piezoelectric ceramic materials such as those producible in conventional mass-production systems while lowering their sintering temperature with little change in their characteristics.

To solve the problems, the invention provides a piezoelectric ceramic composition comprising an essential component that contains Pb, Zr, Ti and O, and a side component that contains Mo, in which the amount of the side component containing Mo is from about 0.06% by weight to about 5.0% by weight, in terms of $MoO_3$, relative to the amount of the essential component.

Preferably, in this composition, the amount of the side component containing Mo is from about 0.1% by weight to about 2.0% by weight, in terms of $MoO_3$, relative to the amount of the essential component.

The invention also provides a method for producing piezoelectric ceramics, which is as follows:

First, an essential component that contains Pb, Zr, Ti and O is calcined to give a ceramic powder of the essential component only. Next, a side component containing Mo is added to the resulting ceramic powder so that the amount of the side component to be in the resulting mixture is from about 0.06% by weight to about 5.0% by weight, in terms of $MoO_3$, relative to the amount of the essential component. Then, the resulting mixture is ground to give a fine powder. Finally, the fine powder is fired.

BRIEF DESCRIPTION OF THE DRAWINGS

FIG. 3 shows the relationship between the firing temperature of two samples A-4 with $MoO_3$ added after or before the calcination of the essential component and the bulk density of those samples.

DESCRIPTION OF PREFERRED EMBODIMENTS OF THE INVENTION

Now, some preferred embodiments of the invention are described below, which, however, are not intended to restrict the scope of the invention.

EXAMPLE 1

First prepared were $Pb_3O_4$, $ZrO_2$, $TiO_2$, $Sb_2O_3$, $SnO_2$ and $CrO_3$ as the starting materials for the essential component of piezoelectric ceramic compositions to be produced herein.

Next, these materials were weighed to give piezoelectric ceramic compositions A and B, which are mentioned below, and wet mixed for 4 to 32 hours.

Piezoelectric ceramic composition A:

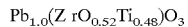
$Pb_{1.0}(Zr_{0.52}Ti_{0.48})O_3$

Piezoelectric ceramic composition B:

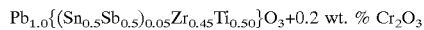
$Pb_{1.0}\{(Sn_{0.5}Sb_{0.5})_{0.05}Zr_{0.45}Ti_{0.50}\}O_3 + 0.2$ wt. % $Cr_2O_3$ Next, each of these mixtures was dewatered, dried, and then calcined at 800 to 900° C. for 2 hours to give a ceramic powder of the essential component of composition A or B.

Next, a side component, $MoO_3$ was added to the ceramic powder of the composition A as in Table 1 below, and to the ceramic powder of the composition B as in Table 2 below. The amount of $MoO_3$ added falls between 0.0 and 8.0% by weight relative to the amount the composition A or B.

TABLE 1

Piezoelectric Ceramic Composition A

| Sample No. | $MoO_3$ Content (wt. %) |
|---|---|
| A-1* | 0.0 |
| A-2* | 0.03 |
| A-3 | 0.06 |
| A-4 | 0.1 |
| A-5 | 0.5 |
| A-6 | 1.0 |
| A-7 | 2.0 |
| A-8 | 5.0 |
| A-9* | 8.0 |

TABLE 2

Piezoelectric Ceramic Composition B

| Sample No. | $MoO_3$ Content (wt. %) |
|---|---|
| B-1* | 0.0 |
| B-2* | 0.03 |
| B-3 | 0.06 |
| B-4 | 0.1 |
| B-5 | 0.5 |
| B-6 | 1.0 |
| B-7 | 2.0 |
| B-8 | 5.0 |
| B-9* | 8.0 |

Figure 1:
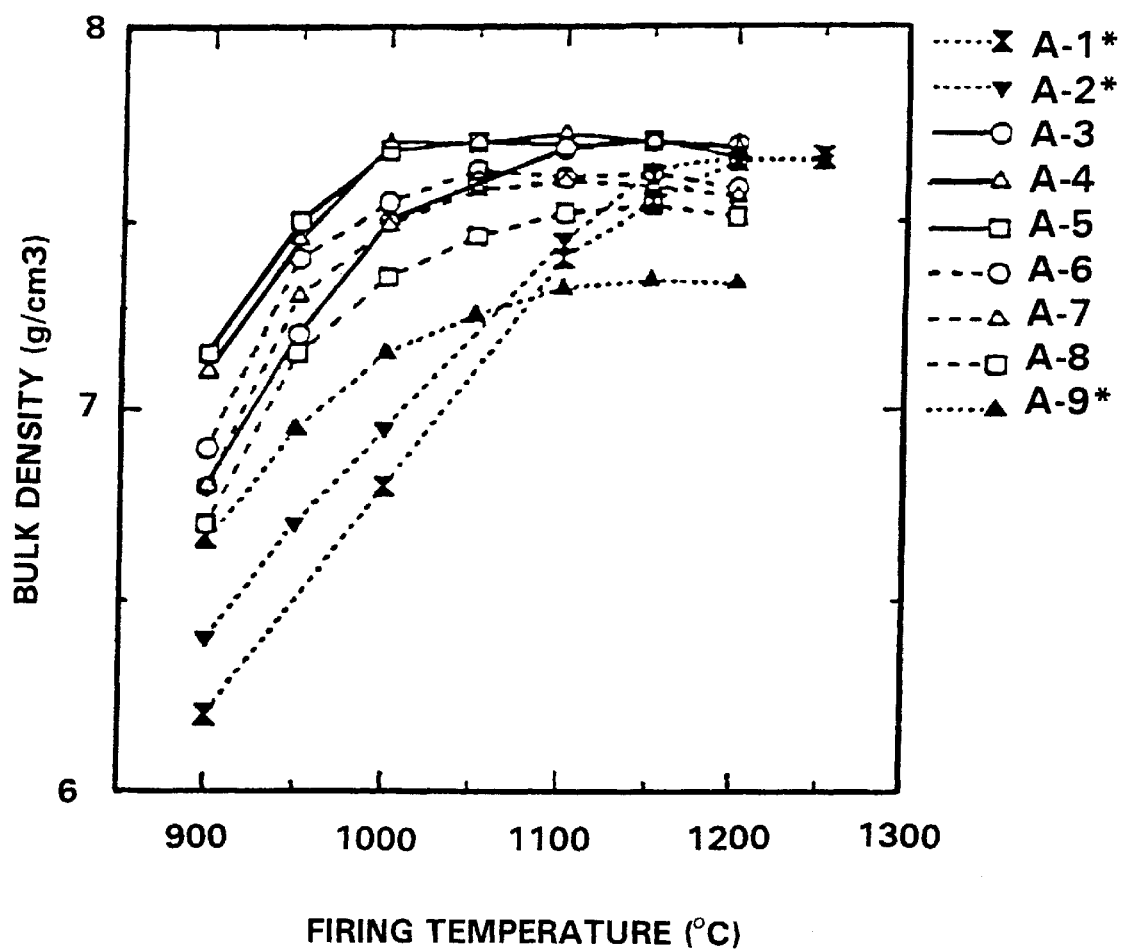
FIG. 1 shows the relationship between the firing temperature of samples A-1 to A-9 in Table 1 in Example 1 and the bulk density of those samples.
Figure 2:
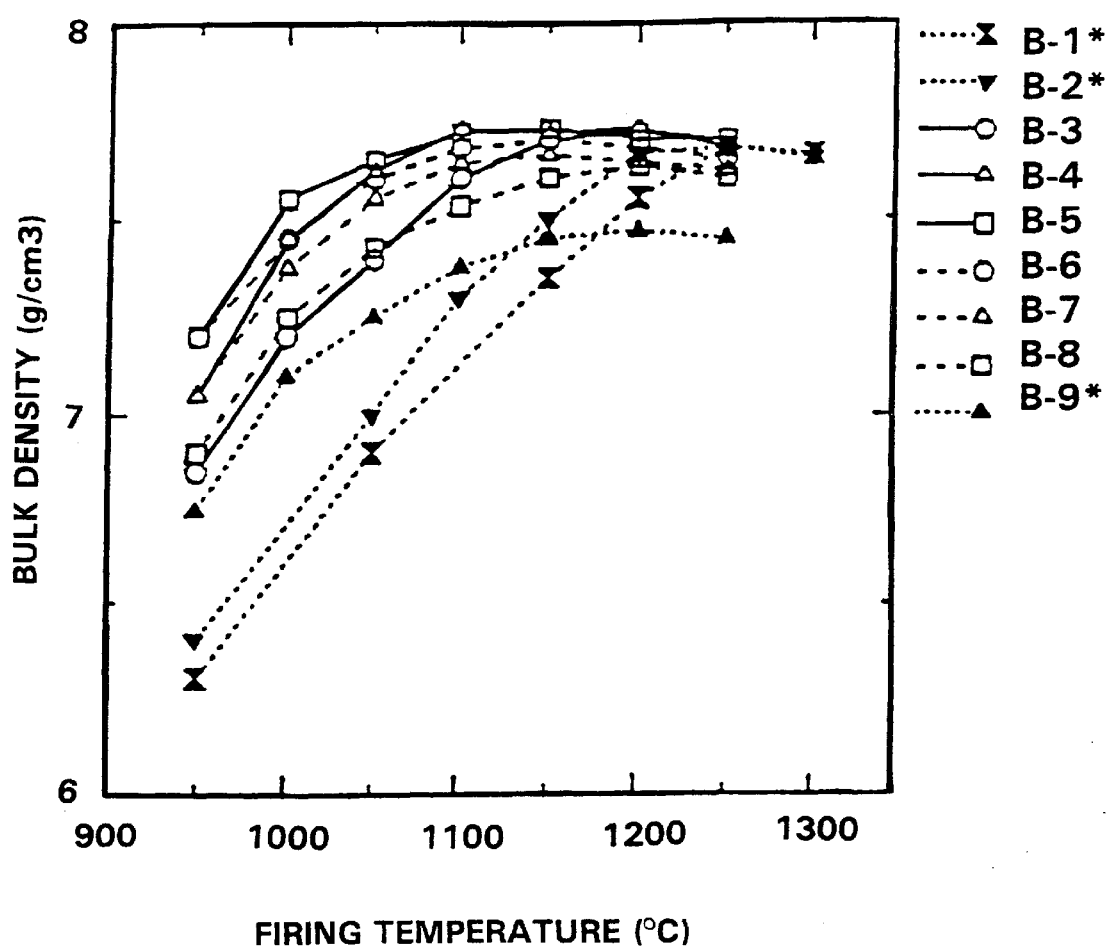
FIG. 2 shows the relationship between the firing temperature of samples B-1 to B-9 in Table 2 in Example 1 and the bulk density of those samples.

In these Tables 1 and 2 and also in Tables 3 and 4 and FIGS. 1 to 3 mentioned hereinunder, the samples marked with an asterisk (*) are outside the invention.

After the side component $MoO_3$ was added to the ceramic powder of the essential component, from 2 to 5% by weight of a polyvinyl alcohol binder was added thereto and mixed and wet milled for 8 to 32 hours to obtain a fine powder having a mean grain size of from 0.6 to 0.8 $\mu m$.

This fine powder was granulated and press-shaped under a pressure of from 1 to 1.5 tons/cm$^3$ to obtain circular discs each having a diameter of 12 mm and a thickness of 1.2 mm. These discs were fired at a temperature falling between 900 and 1300° C.

The bulk density of each sintered disc was obtained from its volume and weight. The relationship between the bulk density and the firing temperature is shown in FIG. 1 and FIG. 2. Precisely, FIG. 1 shows the relationship between the firing temperature at which each disc made from the fine powder comprised of the piezoelectric ceramic composition A and a varying amount of $MoO_3$ (Table 1) was fired, and the bulk density of the fired disc; and FIG. 2 shows the relationship between the firing temperature at which each disc made from the fine powder comprised of the piezoelectric ceramic composition B and a varying amount of $MoO_3$ (Table 2) was fired, and the bulk density of the fired disc.

From FIG. 1 and FIG. 2, it is seen that the bulk density of each disc was increased and saturated with the increase in the firing temperature.

It is seen that samples A-3 to A-8 and samples B-3 to B-8, to which was added from 0.06% by weight to 5.0% by weight of $MoO_3$, reached a saturated bulk density at a lower firing temperature than samples A-1 and B-1, to which was not added $MoO_3$ (0.0% by weight). That is, the firing temperature of the former is lower than that of the latter by from 100 to 200° C. or so. This is believed to be because the melting point of $MoO_3$ is about 800° C., and $MoO_3$ forms a liquid phase at about its melting point to thereby effectively promote the intergranular diffusion in each disc.

The data of samples A-2 and B-2, to which the amount of $MoO_3$ added was smaller than 0.06% by weight, indicate that such a small amount of $MoO_3$ was almost ineffective in lowering the sintering temperature of those samples. On the other hand, the data of samples A-9 and B-9, to which the amount of $MoO_3$ added was larger than 5.0% by weight, indicate that the sinterability of those samples containing such a large amount of $MoO_3$ is greatly worsened even though the sintering temperature which gave a saturated bulk density could be lowered by about 100° C.

From the discs fired at varying firing temperatures as in the above, those as fired to have an almost saturated bulk density were selected. Thick silver electrode patterns were printed on the both surfaces of each of the thus-selected discs, to which was applied an direct-current electric field of from 2.0 to 4.0 kV/mm for 15 to 60 minutes in an insulating oil at 80 to 120° C., thereby polarizing the discs. Next, these were aged in air at 120 to 200° C. for 30 to 60 minutes to obtain the intended piezoelectric devices.

These piezoelectric devices were tested to obtain their relative dielectric constant ($\epsilon_r$), electromechanical coupling factor (Kp) of the expanding vibration of the disc, and mechanical quality factor (Qmp) of the same vibration, using an impedance analyzer. The data obtained are shown in Table 3 and Table 4 below. Precisely, Table 3 shows the characteristics of the piezoelectric devices as produced using the fine powders shown in Table 1, while Table 4 shows those of the piezoelectric devices as produced using the fine powders shown in Table 2. Tables 3 and 4 also show the firing temperature at which sample was fired to realize a saturated bulk density.

TABLE 3

| Sample No. | Firing Temperature (° C.) | $\epsilon_r$ | Kp (%) | Qmp |
|---|---|---|---|---|
| A-1* | 1200 | 1502 | 45.5 | 115 |
| A-2* | 1150 | 1535 | 45.7 | 109 |
| A-3 | 1100 | 1522 | 46.0 | 120 |
| A-4 | 1000 | 1558 | 47.2 | 102 |
| A-5 | 1000 | 1512 | 46.3 | 108 |
| A-6 | 1050 | 1497 | 45.0 | 118 |
| A-7 | 1050 | 1463 | 44.3 | 111 |
| A-8 | 1100 | 1407 | 42.6 | 93 |
| A-9* | 1100 | 1256 | 32.1 | 74 |

TABLE 4

| Sample No. | Firing Temperature (° C.) | $\epsilon_r$ | Kp (%) | Qmp |
|---|---|---|---|---|
| B-1* | 1250 | 1656 | 54.8 | 82 |
| B-2* | 1200 | 1682 | 55.4 | 79 |
| B-3 | 1150 | 1670 | 55.0 | 76 |
| B-4 | 1100 | 1701 | 55.9 | 73 |
| B-5 | 1100 | 1663 | 54.6 | 80 |
| B-6 | 1100 | 1634 | 53.7 | 87 |
| B-7 | 1100 | 1605 | 52.3 | 85 |
| B-8 | 1150 | 1547 | 48.7 | 71 |
| B-9* | 1150 | 1386 | 38.6 | 63 |

Table 3 and Table 4 show that there is no significant difference between the piezoelectric characteristics of samples A-3 to A-8 and B-3 to B-8, to which was added from 0.06% by weight to 5.0% by weight of $MoO_3$, and those of samples A-1 and B-1, to which was not added $MoO_3$, even though the former samples were fired at firing temperatures lower by from 100 to 200° C. than the latter samples.

In particular, the piezoelectric characteristics of samples A-4 to A-7 and B-4 to B-7, to which was added from 0.1% by weight to 2.0% by weight of $MoO_3$, changed little even though these samples were fired at firing temperatures lower by from 150 to 200° C. than the samples with no $MoO_3$ added thereto. As opposed to those, samples A-3 and B-3, to which the amount of $MoO_3$ added was 0.06% by weight were fired at firing temperatures lower by only 100° C. or so than samples A-1 and B-1 with no $MoO_3$ added thereto, even though the piezoelectric characteristics of the former A-3 and B-3 are almost comparable to those of the latter A-1 and B-1. On the other hand, the piezoelectric characteristics of samples A-8 and B-8, to which the amount of $MoO_3$ added was greater than 5.0% by weight, had somewhat larger changes than those of samples A-4 to A-7 and B-4 to B-7 even though the former samples A-8 and B-8 were fired at firing temperatures lower by about 100° C. than the samples with no $MoO_3$ added thereto.

The data from samples A-2 and B-2, to which the amount of $MoO_3$ added was smaller than 0.06% by weight, indicate that such a small amount of $MoO_3$ was almost ineffective in lowering the sintering temperature of those samples. On the other hand, the data from samples A-9 and B-9, to which the amount of $MoO_3$ added was larger than 5.0% by weight, indicate that the sinterability of those samples containing such a large amount of $MoO_3$ is greatly worsened even though their sintering temperature to give a saturated bulk density could be lowered by about 100° C. In addition, as in Tables 3 and 4, samples A-9 and B-9 are unfavorable as their piezoelectric characteristics significantly changed.

From the above, it is understood that the effective amount of $MoO_3$ to be added to the ceramic powder of the essential component is from about 0.06% by weight to 5.0% by weight, preferably from about 0.1% by weight to 2.0% by weight.

EXAMPLE 2

Herein made was a comparison between the addition of the side component, $MoO_3$, to the calcined piezoelectric powder of the essential component containing Pb, Zr, Ti and O (addition after calcination) and the addition of the same side component to the non-calcined piezoelectric powder of the same essential component (addition before calcination) with respect to the effect of the side component to improve the low-temperature sinterability of the powder mixture and to the piezoelectric characteristics of the sintered samples.

In the same manner as in Example 1, sample No. A-4 of Table 1 above was prepared. This corresponds to the former case of "addition of the side component after calcination", in which added was the side component $MoO_3$ to the calcined piezoelectric powder of the essential component.

On the other hand, a sample of the latter case of "addition of the side component before calcination" was prepared as follows: $Pb_3O_4$, $ZrO_2$, $TiO_2$ and $MoO_3$ were weighed to have the same composition as that of sample No. A-4 in Table 1 above, and wet mixed for 16 hours. Then, the resulting mixture was dewatered and dried, and thereafter calcined at 900° C. for 2 hours. Added was 5% by weight of a polyvinyl alcohol binder and followed by further mixing and grinding still wet for 16 hours to obtain a fine powder having a mean grain size of 0.7 μm.

The two samples thus prepared were separately shaped, fired and processed in the same manner as in Example 1 to give piezoelectric devices, which were tested also in the same manner as in Example 1 to evaluate their piezoelectric characteristics.

The relationship between the firing temperature of each sample and the bulk density thereof is shown in FIG. 3. For reference, the relationship between the firing temperature of sample A-1 and the bulk density thereof is also shown in FIG. 3.

FIG. 3 shows that the side component, $MoO_3$ added to the calcined powder was more effective in improving the low-temperature sinterability of the powder mixture than that added to the non-calcined powder. However, it is seen that even though the $MoO_3$ side component was added to the non-calcined powder, it was still effective in improving the low-temperature sinterability of the powder mixture when compared the case of sample A-1 with no $MoO_3$ added thereto.

FIG. 3 also shows the increase in the firing temperature resulted in the saturation of the bulk density of the fired samples. Using the sintered samples of which the bulk density was almost saturated, prepared were piezoelectric devices, and these devices were tested to determine their piezoelectric characteristics. The piezoelectric characteristics of those devices are shown in Table 5 below along with the firing temperatures at which the piezoelectric mixtures were fired.

TABLE 5

| Sample | Firing Temperature (° C.) | $\epsilon_r$ | Kp (%) | Qmp |
|---|---|---|---|---|
| with $MoO_3$ added after calcination | 1000 | 1558 | 47.2 | 102 |
| with $MoO_3$ added before calcination | 1050 | 1523 | 46.3 | 108 |

Comparing the sample with $MoO_3$ added after calcination and that with $MoO_3$ added before calcination, Table 5 shows that there is no significant difference between these samples in their piezoelectric characteristics even though the firing temperatures of the two somewhat differ. The two samples are both satisfactory.

As is understood from the data in FIG. 3 and Table 5, $MoO_3$ added after or before calcination to those samples was effective in improving the low-temperature sinterability of the samples, even though its effect somewhat varies, and the piezoelectric characteristics of the samples with $MoO_3$ added thereto were good. However, the addition of $MoO_3$ after calcination is preferred to that before calcination, since the effect of $MoO_3$ in improving the low-temperature sinterability of the powder mixture is larger in the former than in the latter. In addition, the former is advantageous in that any conventional piezoelectric ceramic materials, such as those to be produced in conventional mass-production systems, can be used to obtain favorable piezoelectric ceramic compositions while improving the low-temperature sinterability of the compositions and with little change in the piezoelectric characteristics of the compositions.

Modifications

In the above-mentioned Examples, used was the two-component composition of $PbZrO_3$-$PbTiO_3$ or the three-component composition of $Pb(Sb_{0.5}Sn_{0.5})O_3$-$PbZrO_3$-$PbTiO_3$ to which had been added a minor amount of $Cr_2O_3$, as the essential component of the piezoelectric ceramic composition of the invention. However, the essential component in the piezoelectric ceramic composition of the invention is not limited to only those two. Needless-to-say, any other multi-component compositions containing Pb, Zr, Ti and O and even others derived from such multi-component compositions by substituting a part of the constituent components with any other elements such as Sr, Mn, Nb and the like, and still others containing minor additives such as oxides of such substituent elements are usable in the invention as the essential component. Likewise, while $MoO_3$ is preferred, other Mo containing materials can be used.

As has been mentioned hereinabove and is obvious from the data in Examples 1 and 2, the addition of a specific amount of the Mo side component to conventional piezoelectric ceramic materials is effective in improving the low-temperature sinterability of the compositions of those materials without a significant change in the piezoelectric characteristics of the compositions.

Accordingly, the piezoelectric ceramic composition of the invention is advantageously used in forming piezoelectric ceramic layers in monolithic piezoelectric structures which must be co-fired along with electrode materials. Where the piezoelectric ceramic composition of the invention is used in producing monolithic piezoelectric structures, therefore, it is unnecessary to use expensive electrode materials such as Pt, and any inexpensive materials such as AgPd can be used as electrode materials.

According to the method of the invention for producing piezoelectric ceramics, the side component containing Mo is added to the calcined essential component. As has been demonstrated in Example 2, the side component added to the essential component after its calcination is more effective in improving the low-temperature sinterability of the piezoelectric ceramic composition than that added thereto prior to its calcination.

Where the piezoelectric ceramic composition of the invention is used to produce piezoelectric ceramics, the side component may be added to the calcined essential component as has been mentioned hereinabove. Apart from this embodiment, the side component may also be added to the essential component even prior to its calcination, or any other steps to produce the intended piezoelectric ceramics.

While the invention has been described in detail and with reference to specific embodiments thereof, it will be apparent to one skilled in the art that various changes and modifications can be made therein without departing from the spirit and scope thereof.

What is claimed is:

1. A method for producing a piezoelectric ceramic comprising the steps of:

combining a calcined ceramic powder of a piezoelectric main component comprising Pb, Zr, Ti and O, and an additive which is $MoO_3$ so that the amount of said additive in the resulting mixture is from about 0.1% by weight to about 2.0% by weight relative to the amount of said main component, and said combination is fired.

2. A method for producing a piezoelectric ceramic comprising the steps of:

combining a calcined ceramic powder of a piezoelectric main component comprising Pb, Zr, Ti and O, and an additive which is $MoO_3$ so that the amount of said additive in the resulting mixture is from about 0.06% by weight to about 5.0% by weight relative to the amount of said main component, and said combination is fired.

3. A method for producing a piezoelectric ceramic comprising the steps of:

combining a calcined ceramic powder of a piezoelectric main component comprising Pb, Zr, Ti and O, and an additive containing Mo so that the amount of said additive in the resulting mixture is from about 0.06% by weight to about 5.0% by weight, in terms of $MoO_3$, relative to the amount of said main component and wherein said combination is fired.

* * * * *